(12) United States Patent
Lee (10) Patent No.: US 7,981,783 B2
(45) Date of Patent: Jul. 19, 2011

(54) SEMICONDUCTOR DEVICE AND METHOD FOR FABRICATING THE SAME

(75) Inventor: Mun-Young Lee, Gyeyang-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 454 days.

(21) Appl. No.: 12/115,656

(22) Filed: May 6, 2008

(65) Prior Publication Data

US 2008/0290411 A1    Nov. 27, 2008

(30) Foreign Application Priority Data

May 25, 2007   (KR) .................. 10-2007-0050979

(51) Int. Cl.
*H01L 21/00*    (2006.01)
(52) U.S. Cl. .................. 438/526; 438/391; 257/374
(58) Field of Classification Search .................. 438/391, 438/526; 257/374
See application file for complete search history.

(56) References Cited

U.S. PATENT DOCUMENTS

| 6,750,489 | B1 * | 6/2004 | Merrill | 257/292 |
| 6,806,131 | B2 * | 10/2004 | Bromberger et al. | 438/221 |
| 6,890,804 | B1 * | 5/2005 | Shibib et al. | 438/163 |
| 6,903,421 | B1 | 6/2005 | Huang et al. | |
| 7,126,166 | B2 * | 10/2006 | Nair et al. | 257/110 |
| 7,276,419 | B2 * | 10/2007 | Khemka et al. | 438/305 |
| 7,511,319 | B2 * | 3/2009 | Zhu et al. | 257/213 |
| 2004/0222488 | A1 | 11/2004 | Abadeer et al. | |
| 2008/0067615 | A1 * | 3/2008 | Kim | 257/408 |

FOREIGN PATENT DOCUMENTS

JP   2003-086800   3/2003

* cited by examiner

Primary Examiner — Jarrett Stark
Assistant Examiner — Nicholas Tobergte
(74) Attorney, Agent, or Firm — Sherr & Vaughn, PLLC (57) ABSTRACT

A semiconductor device including at least one drift region formed near a channel region on a substrate, a first buried insulating layer formed in the drift region, and a first reduced surface field region interposed between the first buried insulating layer and the drift region. Accordingly, the semiconductor device provides first reduced surface field regions arranged between drift regions and first buried insulating layers, thus having advantages of improved junction integrity, suitability for LDMOS transistors employing a high operation voltage and reduced total size.

15 Claims, 7 Drawing Sheets

SEMICONDUCTOR DEVICE AND METHOD FOR FABRICATING THE SAME

This application claims priority under 35 U.S.C. §119 to Korean Patent Application No. 10-2007-0050979 (filed on May 25, 2007) which is hereby incorporated by reference in its entirety.

BACKGROUND

Figure 1A:
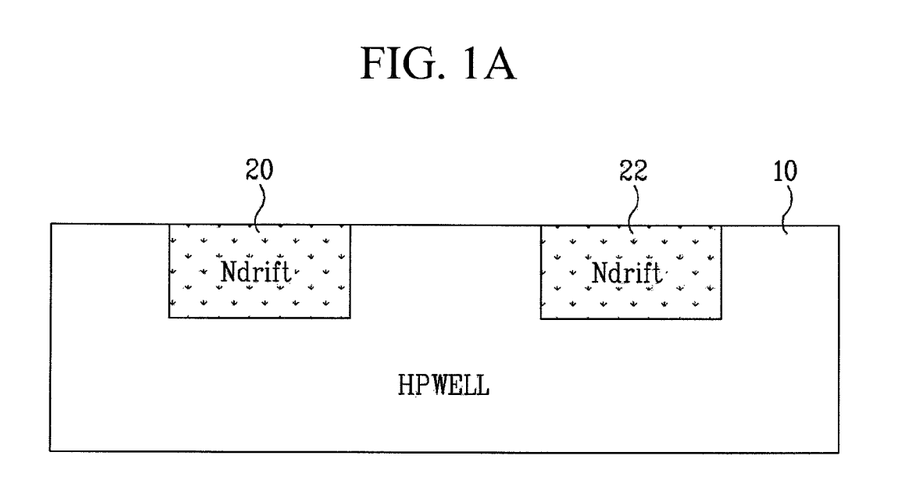
FIGS. 1A to 1C illustrate a LDMOS transistor.

As illustrated in example FIG. 1A, generally, a LDMOS transistor may include two n-type drift regions (Ndrifts) 20, 22 formed in high-voltage p-type well (HPWELL) 10.

Figure 1B:
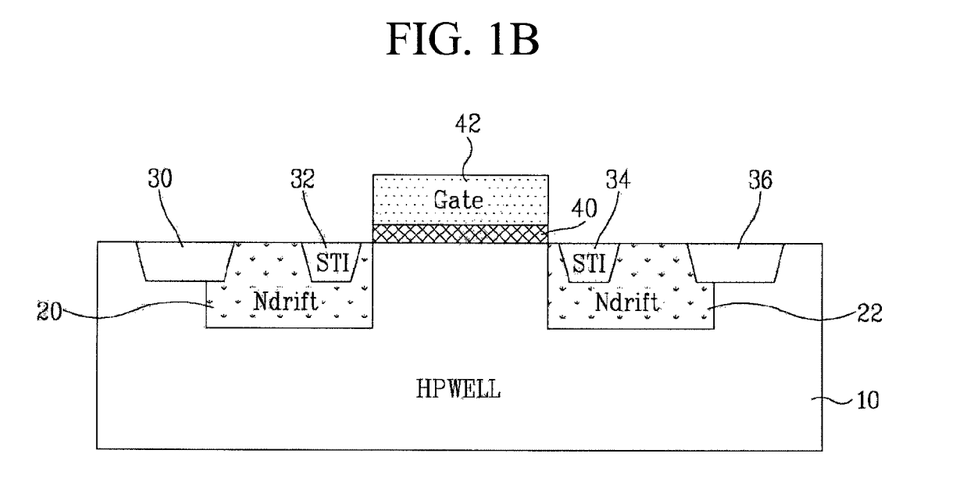

As illustrated in example FIG. 1B, shallow trench isolations (STIs) 30, 32, 34 and 36 may then be formed in predetermined regions in HPWELL 10 and Ndrifts 20, 22. Gate insulating film 40 and gate 42 may then be sequentially formed on and/or over HPWELL 10.

Figure 1C:
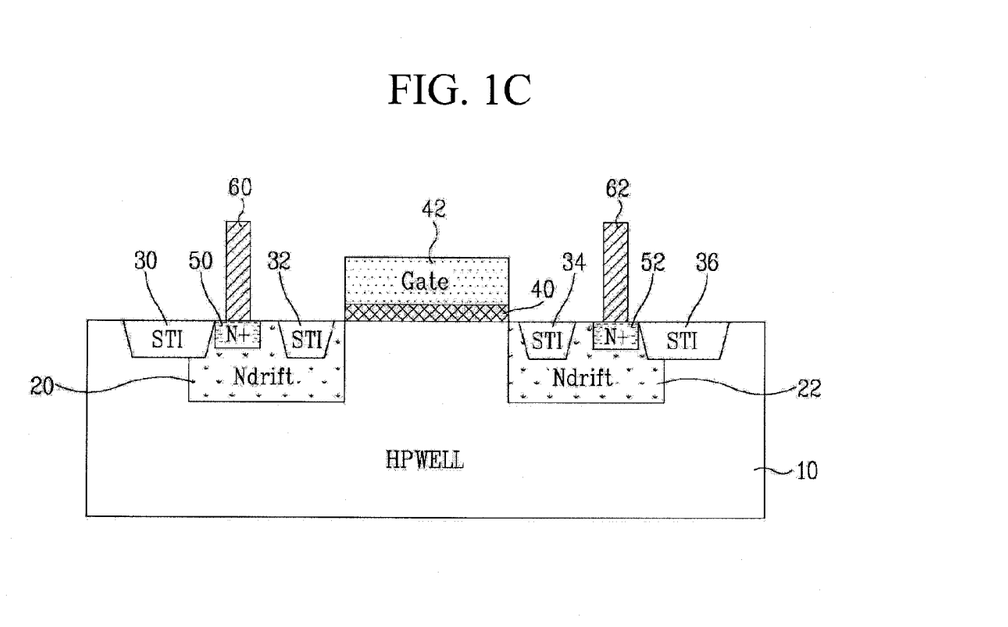

As illustrated in example FIG. 1C, high-concentration n$^+$-type source/drain extension regions 50, 52 may be then be formed in Ndrifts 20, 22, respectively. Thereafter, through a contact formation process, contacts 60, 62 are formed on and/or over source/drain extension regions 50, 52 formed in Ndrifts 20, 22, respectively.

STIs 32, 34 are provided in order to improve a breakdown voltage of Ndrifts 20, 22 that surround source/drain extension regions 50, 52 in the high voltage transistors. However, an electric field applied in a channel region between source/drain extension regions 50, 52 may be higher than an electric field applied between Ndrifts 20, 22 and the substrate. Accordingly, gate 42 must have a length not less than a predetermined level in order to improve the breakdown voltage between the source and the drain. Consequently, highly integration devices cannot be obtained.

SUMMARY

Embodiments relate to a semiconductor device such as a lateral, double-diffused MOS (LDMOS) transistor and a method for fabricating the same.

Embodiments relate to a semiconductor device and a method for fabricating the same, that can enhance a junction breakdown voltage by reducing a maximum electric field generated in STIs located inside drift regions and gate edge regions.

Embodiments relate to a semiconductor device that can include at least one of the following: at least one drift region formed near a channel region on a substrate; a first buried insulating layer formed in the drift region; and a first reduced surface field region interposed between the first buried insulating layer and the drift region.

Embodiments relate to a method for fabricating a semiconductor device that can include at least one of the following steps: forming at least one drift region near a channel region on a substrate; forming a first trench in the drift region; forming a first reduced surface field region on the inside wall of the first trench; and forming a first buried insulating layer on the first trench provided with the first buried insulating layer.

DRAWINGS

Example

Example

Example

Example

Example

Example

DESCRIPTION

Reference will now be made in detail to the semiconductor device according to preferred embodiments of the present invention with reference to the annexed drawings. One case, wherein the semiconductor device is a lateral double diffused MOS (LDMOS) transistor, is illustrated but the present invention is not limited thereto.

Figure 2:
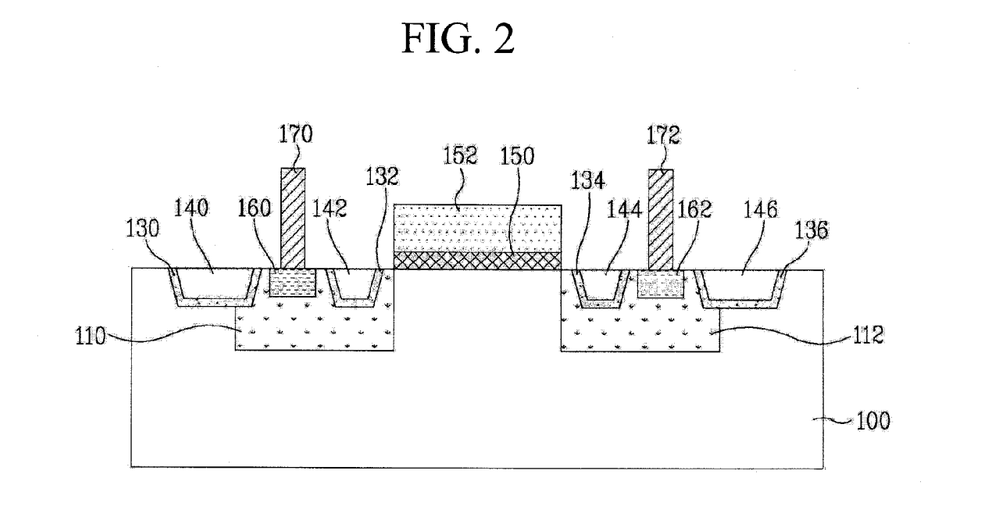
FIG. 2 illustrates an LDMOS transistor, in accordance with embodiments.

Example FIG. 2 illustrates an LDMOS transistor that can include high-voltage well 100 and drift regions 110, 112 formed in well 100. Those skilled in the art will readily appreciate that reference numeral 100 represents not only the well, but also the substrate. Reduced surface field regions (RESURF) 130, 132, 134 and 136 can be formed in well 100 and buried insulating layers 140, 142, 144 and 146 can be formed on and/or over RESURF 130, 132, 134 and 136, respectively. Gate insulating film 150 and gate 152 can be formed on and/or over well 100 and between drift regions 110, 112. Source/drain extension regions 160, 162 can be formed in drift regions 110, 112 and contacts 170, 172 can be formed on and/or over source/drain extension regions 160, 162, respectively.

First buried insulating layers 142, 144 can be formed in drift regions 110, 112, respectively. First buried insulating layers 142, 144 can function to enhance breakdown voltages of drift regions 110, 112, respectively. Unlike first buried insulating layers 142, 144, second buried insulating layers 140, 146 can be formed in well 100 and drift regions 110, 112 and can function to define an active region and a device isolation region. Alternatively, second buried insulating layers 140, 146 can be formed only in a portion of well 100 where there are no drift regions 110, 112. First buried insulating layers 142, 144 and second buried insulating layers 140, 146 can be in the form of shallow trench isolations (STIs).

In accordance with embodiments, first reduced surface field regions 132, 134 can be formed between first buried insulating layers 142, 144 and drift regions 110, 112, respectively. First reduced surface field regions 132, 134 decrease an electric field present on the interface between source/drain extension regions 160, 162, and particularly, on the interfaces between first reduced surface field regions 132, 134 and the channel region. This serves to enhance junction integrity. Accordingly, first reduced surface field regions 132, 134 can be suitable for use in LDMOS transistors requiring a high operating voltage, and thus, can decrease the length of the channel region determining the size of LDMOS transistors. Second reduced surface field regions 130, 136 can be formed between second buried insulating layers 140, 146 and well 100. For example, first reduced surface field regions 132, 134 and second reduced surface field regions 130, 136 can have a thickness not more than 500 Å and a doping concentration of $10^{11}$ to $10^{12}$ ions/cm$^2$.

Gate insulating film 150 and gate 152 can be sequentially formed in the channel region on and/or over well 100. High-concentration source/drain extension regions 160, 162 can be formed in drift regions 110, 112, respectively. Contacts 170, 172 can be formed in source/drain extension regions 160, 162, respectively. The doping concentrations of source/drain extension regions 160, 162 can be higher than those of drift regions 110, 112. The doping concentrations of drift regions 110, 112 can be higher than those of first reduced surface field regions 132, 134. The doping concentrations of first reduced surface field regions 132, 134 can be the same as those of second reduced surface field regions 130, 136.

In accordance with embodiments, when well 100 is formed as a p-type and drift regions 110, 112 are formed as an n-type, first reduced surface field regions 132, 134 and second reduced surface field regions 130, 136 can be formed as either p-type or n-type. On the other hand, when well 100 is formed as an n-type and drift regions 110, 112 are formed as a p-type, first reduced surface field regions 132, 134 and second reduced surface field regions 130, 136 can be formed as n-type.

Hereinafter, a method for fabricating a lateral double diffused MOS (LDMOS) transistor according to the present invention will be illustrated with reference to the annexed drawings.

Figure 3A:
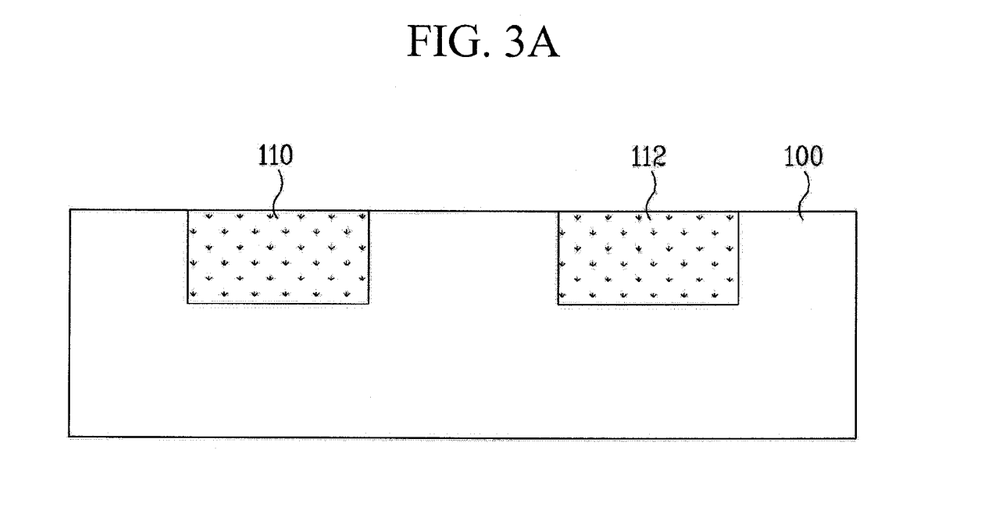
FIGS. 3A to 3D illustrate a method for fabricating an LDMOS transistor, in accordance with embodiments.

As illustrated in example FIG. 3A, at least one drift region 110, 112 can be formed in high voltage well 100. Although the number of drift regions 110, 112 illustrated in example FIG. 3A is two, the present invention is not limited thereto.

Figure 3B:
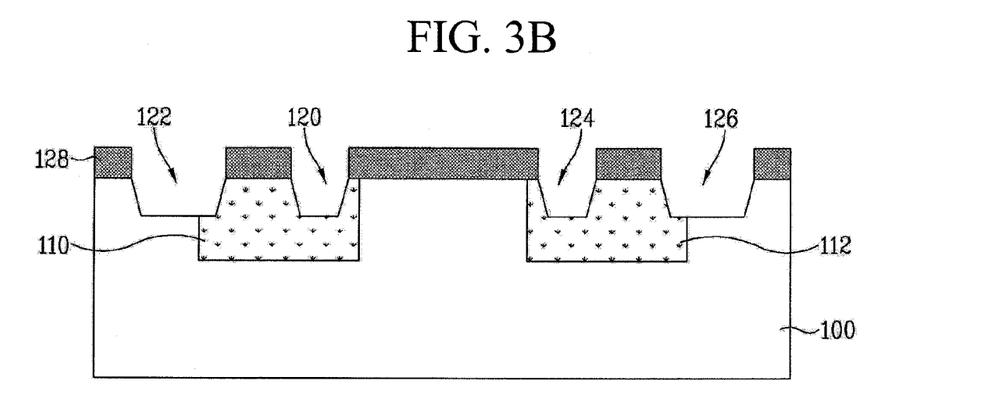

As illustrated in example FIG. 3B, mask patterns 128 can then be formed on and/or over draft regions 110 and 112 and well 100 through a photolithographic process. Drift regions 110, 112 and well 100 can then be etched using mask patterns 128 as etching masks to form trenches 120, 122, 124 and 126. First trenches 120, 124 can be formed in only drift regions 110, 112 while second trenches 122, 126 can be formed in well 100 and drift regions 110, 112 to define an active region and a device isolation region. It is preferred that first trenches 120, 124 be formed in drift regions 110 and 112, respectively. On the other hand, second trenches 122, 126 can be formed only in a portion of well 100 where there are no drift regions 110, 112.

Figure 3C:
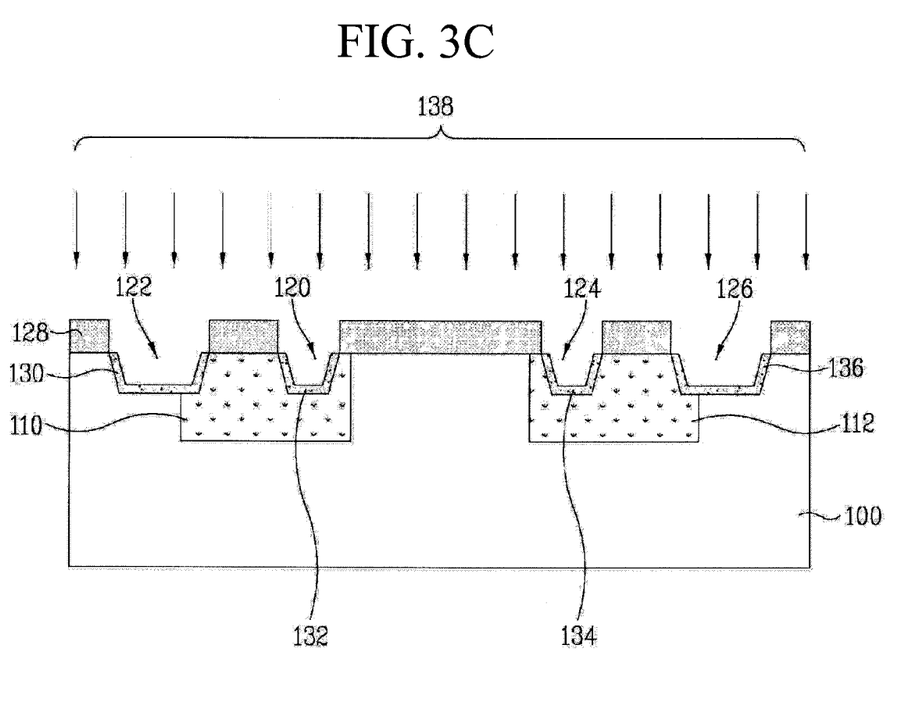

As illustrated in example FIG. 3C, a plurality of impurity ions 138 can then be implanted in first trenches 120, 124 exposed through masks 128 to form first reduced surface field regions 132, 134 on and/or over the inner walls of first trenches 120, 124, respectively. Impurity ions 138 can also be implanted into second trenches 122, 126 to form second reduced surface field regions 130, 136 on and/or over the inner walls of second trenches 122, 126, respectively. Those skilled in that art will readily appreciate that a thermal diffusion process may follow implantation of the impurity ions 138. Alternatively, unlike the structure illustrated in example FIG. 3C, in accordance with embodiments, second reduced surface field regions 130, 136 can be excluded. In this case, the masks must be patterned so that impurity ions 138 can be implanted only in first trenches 120, 124.

Figure 3D:
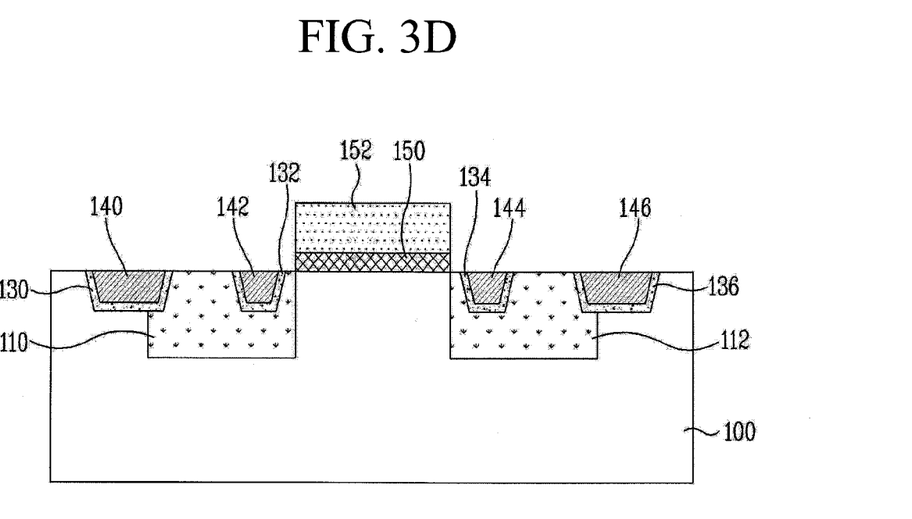

As illustrated in example FIG. 3D, after formation of first reduced surface field regions 132, 134 and second reduced surface field regions 130, 136, insulating materials can then be gap filled into first trenches 120, 124 and second trenches 122, 126 and then subjected to chemical mechanical polishing (CMP) to form STI-shaped first buried insulating layers 142, 144 and second buried insulating layers 140, 146. First buried insulating layers 142, 144 and second buried insulating layers 140, 146 can be composed of $O_3$ TEOS or a high density plasma (HDP) oxide.

Gate insulating film 150 and gate 152 can then be formed by depositing a gate insulating material on and/or over the channel region of well 100, depositing polysilicon on and/or over the gate insulating material, forming mask patterns on and/or over the polysilicon though a photolithographic process, and etching the polysilicon and the gate insulating material using the mask patterns as etching masks.

As illustrated in example FIG. 3D, after formation of gate insulating film 150 and gate 152, high-concentration ions can then be implanted in drift regions 110, 112 interposed between first buried insulating films 142, 144 and second buried insulating films 140, 146, respectively, to form source/drain extension regions 160, 162, as illustrated in example FIG. 2. After the formation of source/drain extension regions 160, 162, contacts 170, 172 can be formed on and/or over source/drain extension regions 160, 162, respectively, through a contact formation process.

Figure 4:
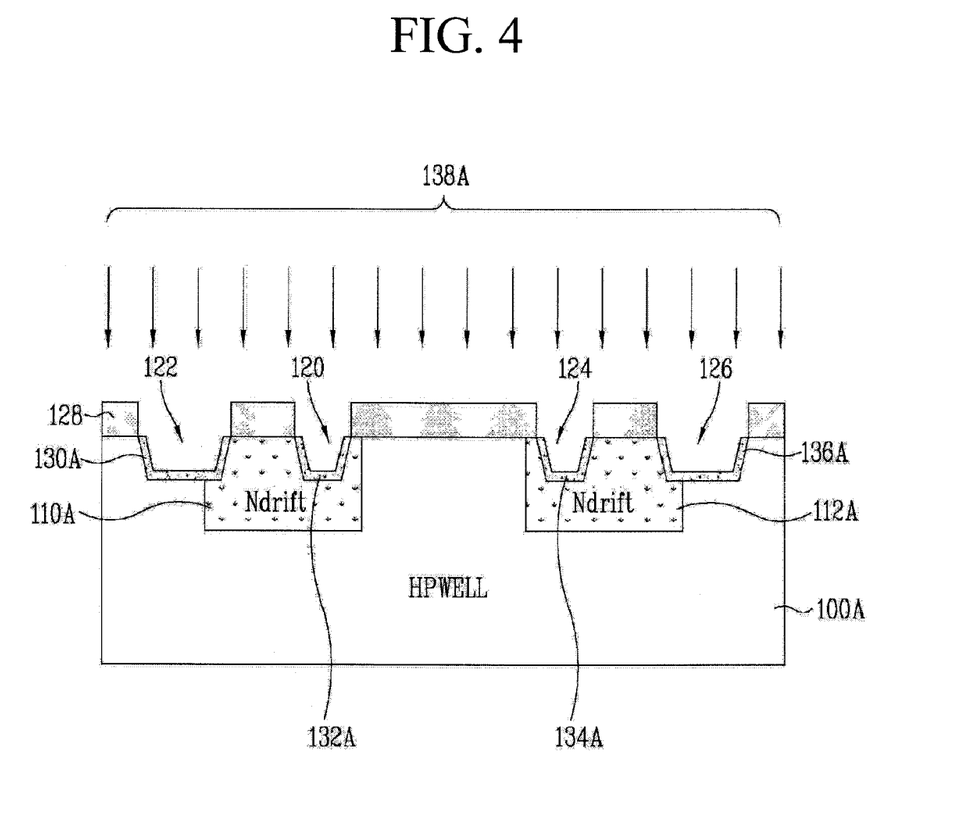
FIG. 4 illustrates a method for forming first and second reduced surface field regions depending on conduction types of respective regions, in accordance with embodiments.

As illustrated in example FIG. 4, when high voltage well (HPWELL) 100A is formed as a p-type, and Ndrifts 110A, 112A are formed as n-type, p-type impurity (e.g., boron) ions 138A can be implanted in the inner walls of trenches 120, 122, 124 and 126 to form reduced surface field regions 130A, 132A, 134A and 136A.

Figure 5:
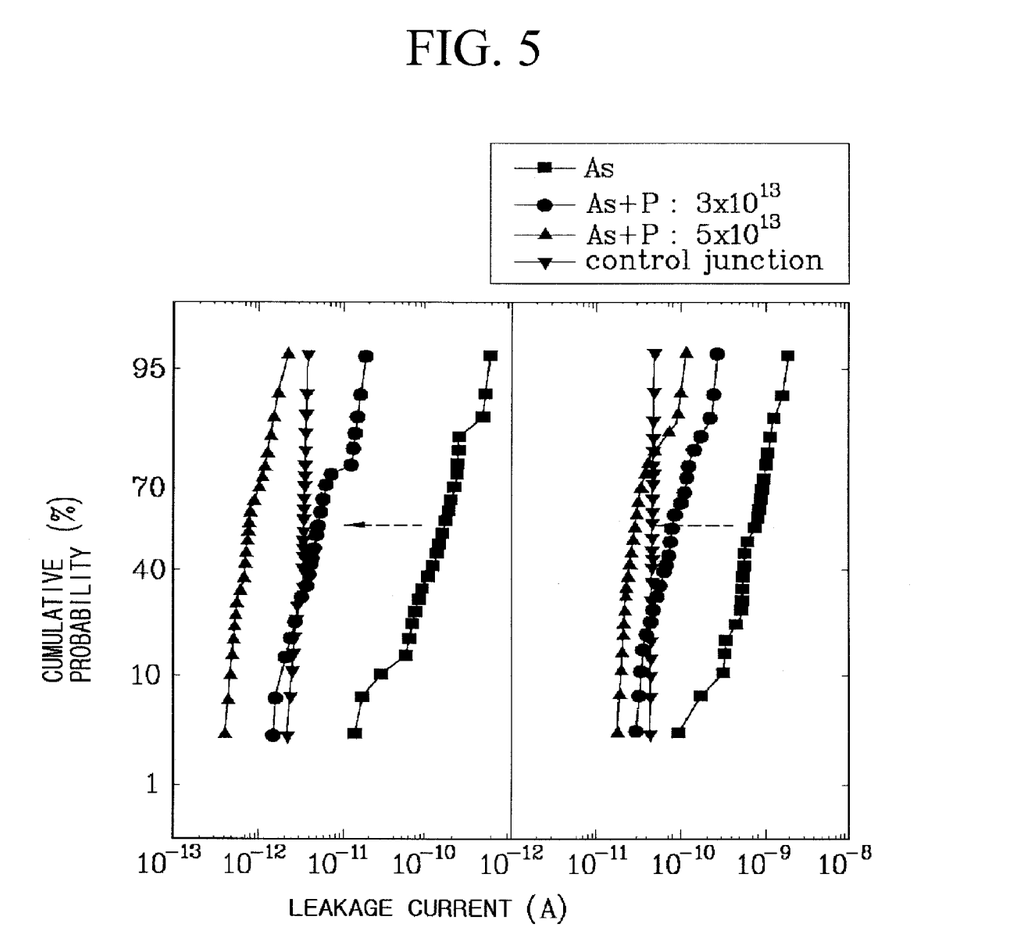
FIG. 5 is a graph illustrating variation in characteristics according to double junction structures, in accordance with embodiments.

Example FIG. 5 is a graph illustrating variation in characteristics according to a double junction structure in which a horizontal axis and a vertical axis represent a leakage current and a cumulative probability, respectively. The unit for leakage current is amperes (A) and the unit for cumulative probability is percent (%). It can be seen from example FIG. 5 that the leakage current varies depending upon the type of impurity ions 138 (e.g., arsenic (As), phosphorus (P) or a combination thereof) that are implanted, and the concentration of the impurity ions.

When high voltage well 100A is formed as a p-type and drift regions 110A, 112A are formed as n-type, n-type impurity (e.g., arsenic) ions 138A can be implanted in the inner walls of first trenches 120, 124 to form n-type reduced surface field regions 130A, 132A, 134A and 136A. Accordingly, each drift region 110A, 112A and first reduced surface field regions 132A, 134A are n-type, thus forming a double junction structure. As such, in the case where the LDMOS transistor has the double junction structure, the leakage current can be reduced, as illustrated in example FIG. 5.

Figure 6:
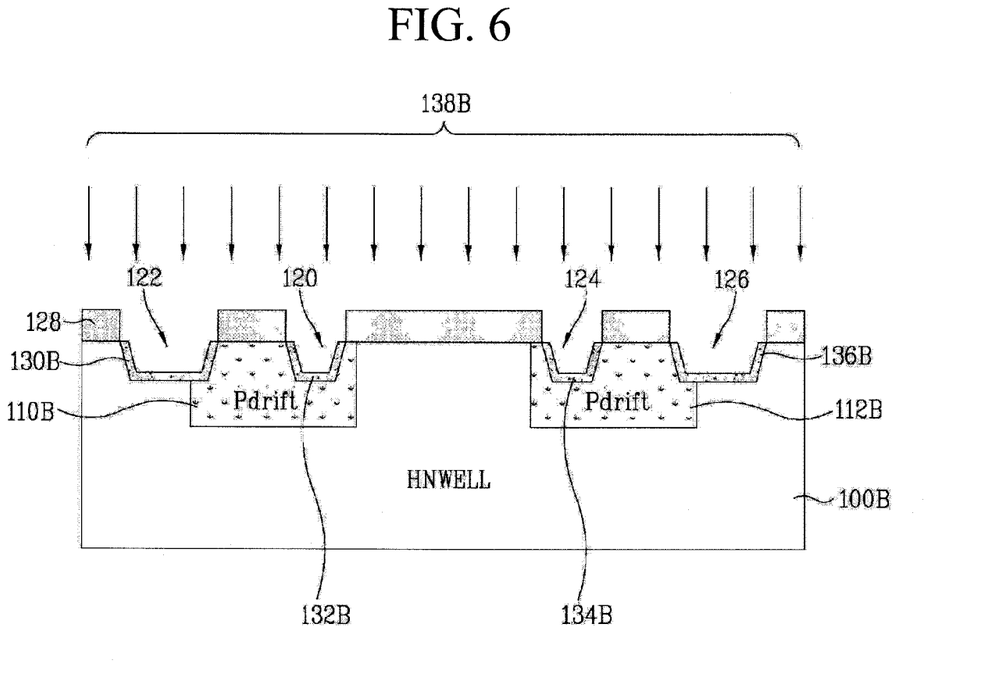
FIG. 6 illustrates a method for forming first and second reduced surface field regions depending on conduction types of respective regions in accordance with embodiments.

As illustrated in example FIG. 6, when high voltage well (HNWELL) 100B is formed as an n-type and drift regions 110B, 112B are formed as p-type, n-type impurity (e.g., P or As) ions can be implanted in the inner walls of trenches 130B, 132B, 134B and 136B to form reduced surface field regions 130B, 132B, 134B and 136B.

As apparent from the fore-going, the semiconductor device and the method for fabricating the same in accordance with embodiments can provide first reduced surface field regions provided between drift regions and first buried insulating layers, and thus, have the following advantages.

First, it is possible to improve junction integrity of drain extended MOS (DEMOS) transistors including general RESURF (LOCOS or STI) regions, i.e., LDMOS transistors.

Second, the semiconductor device and the method reduce a maximum electric field generated in buried insulating layers inside draft regions and gate edge regions, thereby improving junction breakdown voltage. Accordingly, the semiconductor device and the method of the same are suitable for LDMOS transistors employing a high operation voltage.

Third, the LDMOS transistor in accordance with embodiments can include a shortened channel region due to a reduced electric field of the channel region, thus realizing a reduction in total size, as compared to other LDMOS transistors.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a drift region formed adjacent a channel region in a substrate;
   a first buried insulating layer formed in the drift region;
   a first reduced surface field region interposed between the first buried insulating layer and the drift region;
   a second buried insulating layer formed in the substrate defining an active region and a device isolation region; and
   a second reduced surface field region interposed between the second buried insulating layer and the substrate.

2. The semiconductor device of claim 1, wherein when the substrate has a first conductive type and the drift region has a second conductive type, the first reduced surface field region has the first conductive type.

3. The semiconductor device of claim 1, wherein when the substrate has a first conductive type and the drift region has a second conductive type, the first reduced surface field region has the second conductive type.

4. The semiconductor device of claim 1, wherein the drift region is formed in a well formed in the substrate.

5. The semiconductor device of claim 4, wherein the second buried insulating layer is formed over the well and the drift region.

6. The semiconductor device of claim 4, wherein the second buried insulating layer is formed in a portion of the well other than the drift region.

7. The semiconductor device of claim 4, further comprising:
   a gate formed in the channel region on the well; and
   a source/drain region formed in the drift region interposed between the first buried insulating layer and the second buried insulating layer.

8. A method for fabricating a semiconductor device comprising:
   forming a drift region adjacent a channel region on a substrate;
   forming a first trench in the drift region;
   forming a first reduced surface field region on the inner wall of the first trench;
   forming a first buried insulating layer on the first trench including the first buried insulating layer;
   forming a second trench on the substrate defining an active region and a device isolation region, during formation of the first trench; and then
   forming a second reduced surface field region on the inner walls of the second trench.

9. The method of claim 8, wherein when the substrate has a first conductive type and the drift region has a second conductive type, the first reduced surface field region is formed by implanting the first conductive type of impurity ions in the inner walls of the first trench.

10. The method of claim 8, wherein when the substrate has a first conductive type and the drift region has a second conductive type, the first reduced surface field region is formed by implanting the second conductive type of impurity ions in the inner walls of the first trench.

11. The method of claim 9, wherein the first conductive type is p-type, the second conductive type is n-type and the impurity ions comprise arsenic.

12. The method of claim 8, wherein the drift region is formed in a well formed in the substrate.

13. The method of claim 12, wherein the second trench is formed in the well and the drift region.

14. The method of claim 12, wherein the second trench is formed in a portion of the well other than the drift region.

15. The method of claim 12, further comprising:
   forming a second buried insulating layer on the second trench including the second reduced surface field region; and then
   forming a gate in the channel region on the well; and then
   forming a source/drain region in the drift region between the first buried insulating layer and the second buried insulating layer.

* * * * *